United States Patent

[11] 3,573,683

[72] Inventors Richard S. Marshall;
Allan S. Summers, Ilford, England

[21] Appl. No. 733,102
[22] Filed May 29, 1968
[45] Patented Apr. 6, 1971
[73] Assignee The Plessey Company Limited
Illford, England
[32] Priority June 2, 1967
[33] Great Britain
[31] 25491/67

[54] VARACTOR DIODE TUNED CIRCUIT HAVING SUBSTANTIALLY CONSTANT LOADED Q-FACTOR

8 Claims, 6 Drawing Figs.

[52] U.S. Cl. .......... 334/15, 334/40, 338/13
[51] Int. Cl. .......... H03h 5/12, H03j 3/20
[50] Field of Search .......... 331/36(C), 177 (V); 332/30 (V); 334/15, 40; 338/13

[56] References Cited

UNITED STATES PATENTS

| | | | |
|---|---|---|---|
| 3,095,533 | 6/1963 | Keizer .......... | 334/15X |
| 3,117,293 | 1/1964 | Mortley .......... | 334/15 |
| 3,177,454 | 4/1965 | Van Dijkum et al. .......... | 334/15 |
| 3,192,491 | 6/1965 | Hesselberth et al. .......... | 334/15X |

*Primary Examiner*—Herman Karl Saalbach
*Assistant Examiner*—Paul L. Gensler
*Attorney*—Scrivener, Parker, Scrivener and Clarke

ABSTRACT: A tuned circuit arrangement comprising a tuned circuit having varactor diode means for the tuning thereof over a band of frequencies, and compensation means operative for providing selective damping to said tuned circuit so that the loaded Q-factor of the tuned circuit arrangement remains substantially constant over the frequency band.

Patented April 6, 1971 3,573,683

2 Sheets-Sheet 1

VARACTOR DIODE TUNED CIRCUIT HAVING SUBSTANTIALLY CONSTANT LOADED Q-FACTOR

This invention relates to tuned circuit arrangements and relates more specifically to tuned circuit arrangements in which the tuning element takes the form of one or more varactor diodes.

In UHF tuned circuit arrangements which incorporate varactor diodes ad the tuning element to tune the circuit to cover a band of frequencies, it is necessary to use loaded $Q$-factors which are very close to the $Q$-factor of the varactor diode. Due to the fact that the $Q$-factor of a varactor diode is not constant with changes in frequency, at the low end of the tuning range the loss in the tuned circuit can be high (e.g. 6—10 db.) and hence, most of the loading on the preceding amplifier is due to the varactor. At higher frequencies in the tuning range (and hence higher varactor voltages) the $Q$-factor of the varactor diode increases rapidly, due to the increasing reactances and decreasing series resistance of the diode and this results in the loss in the tuned circuit almost disappearing and in consequence the output loading on the preceding amplifier is greatly reduced causing the effective gain to be increased. This could, in extreme cases, result in the amplifier going unstable. In order to overcome this increase in gain and to enable a reasonably flat gain/frequency response to be obtained some form of compensation must be provided.

According to the present invention a tuned circuit arrangement comprises a tuned circuit having varactor diode means for the tuning thereof over a band of frequencies in dependence upon an applied tuning voltage and compensation means operative for providing selective damping to said tuned circuit so that the loaded $Q$-factor of the tuned circuit arrangement remains substantially constant over the frequency band.

In one arrangement according to the present invention it may be arranged that the compensation mans is effective for providing selective damping in direct dependence upon the applied tuning voltage in which case the compensation means may comprise a seimconductor diode, preferably a PIN diode. In an alternative arrangement it may be arranged that the compensation means is effective for providing selective damping in direct dependence upon the frequency of the tuned circuit in which case the compensation means may comprise a transmission line.

In carrying out the invention using PIN diode means the tuned circuit may comprise a tapped inductance, with Pin diode means interposed between the tap and the applied tuning voltage so that it operates on that part of its admittance/forward current characteristic that is substantially linear.

The PIN diode means may comprise a single PIN diode connected between the tap of the inductance and the applied tuning voltage via a high resistance so that the PIN diode current is substantially proportional to the applied tuning voltage.

Alternatively a single PIN diode may be connected between the tap of the inductance and one end of a resistor, the other end of which is connected to the junction of a potential divider network connected effectively between the applied tuning voltage of opposite polarity so that the PIN diode may be arranged to be reverse biased at low applied tuning voltage levels. The potential divider may have associated with it PN diode means which ensures that the PIN diode current is substantially proportional to the logarithm of the applied tuning voltage. The PN diode means may take the form of two series connected PN diodes connected between the junction of the potential divider and the earth conductor of the circuit, and preferably they will be shunted by an electrical resistance.

In carrying out the invention using a transmission line the compensating means may comprise an effectively short-circuited transmission line in series with a resistance, the length of the transmission line corresponding to between a quarter and half wavelengths of the frequency of the tuned circuit.

The transmission line may take the form of a helical coil positioned coaxially inside a conducting tube, in which case effective short-circuiting as aforesaid may be obtained by means of a capacitor connected between two adjacent ends.

In one arrangement according to the invention, the frequency dependent damping means may be connected in the collector circuit of a transistor and may be arranged to shunt at least part of the tuned circuit by means of a coupling capacitor.

Some exemplary embodiments of the invention will now be described with reference to the accompanying drawings, in which.

As has been hereinbefore stated, the $Q$-factor of a varactor diode increases with frequency and in order to compensate for this it is necessary to provide some form of damping. Since in a varactor tuned circuit the tuned frequency is obtained by applying a tuning voltage to it, it is possible to provide the necessary compensation by providing damping to the tuned circuit that increases as the tuning voltage increases (i.e. as the tuned frequency is increased). Alternatively it is possible to provide damping that increases due to the frequency of the tuned circuit increasing. Embodiments using both forms of damping i.e. voltage dependent damping and frequency dependent damping will hereinafter be described.

Before describing a tuned circuit arrangement according to the present invention using voltage dependent damping it is convenient to discuss some properties of PIN diodes.

Figure 1:
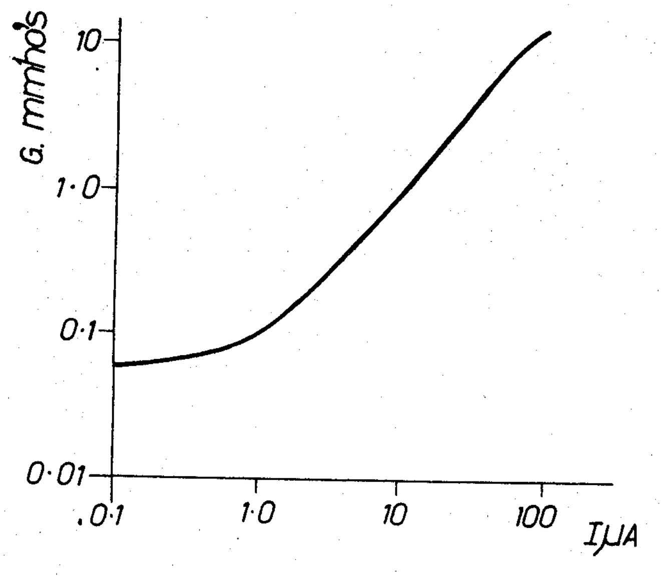
FIG. 1 shows the conductance/current characteristic of a PIN diode.

PIN diodes are normally used with drive currents in the range 0 (or some reverse bias) to 100 ma. to provide a high admittance (e.g. $G\approx 1000$ mmh.) in the forward conducting state and a low admittance (e.g. $G\approx 0.05$ mmh.) in the nonconducting or reversed biased state. However, at very low forward currents (e.g. 1 to 100 $\mu$ A) the real part $G$ of the admittance varies almost linearly with current $I$ as is shown in FIG. 1 and also it is substantially temperature independent. The capacitance of the PIN diode over this current range remains virtually constant and this region of the characteristic is thus ideal for providing the required voltage (or current) dependent damping.

Figure 2:
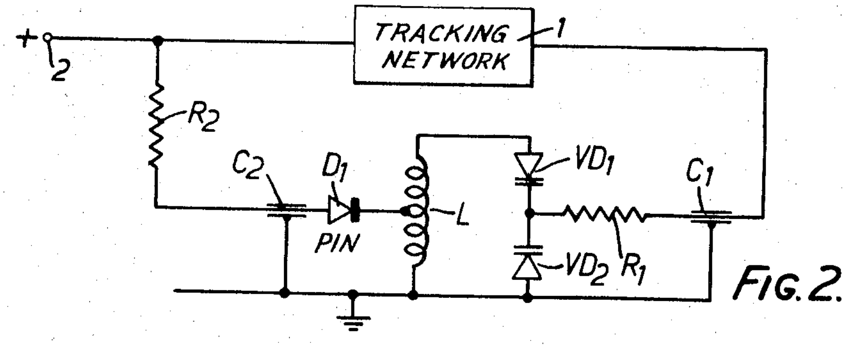
FIG. 2 is a circuit diagram of a tuned circuit arrangement according to the present invention.

FIG. 2 is a circuit diagram of a tuned circuit arrangement using PIN diode compensation in its simplest form. The tuned circuit proper consists of a tapped inductance $L$ which has connected in parallel with it two varactor diodes VD1 and $VD_2$ in back-to-back configuration. The inductance $L$ may also have connected across it a trimmer capacitor (not shown) for tracking purposes. The capacitance of the varactor diodes $VD_1$ and $VD_2$ is varied by arranging that a variable DC voltage is applied to them. This is derived via resistor $R_1$, decoupling feedthrough capacitor $C_1$, and a varactor tracking network 1, from a tuning voltage (which may for example be variable from 10 to 100 volts applied to a terminal 2. A suitable varactor tracking network is described in our copending U.S. Pat. application No. 37289/67. The change in $Q$-factor of the tuned circuit with frequency is compensated for by connecting a PIN diode $D_1$ to the tap on the inductance $L$ and the PIN diode $D_1$ is biased by means of the resistor R 2 connected to the varactor tuning voltage via terminal 2 so that it operates over the linear part of its admittance/current characteristic. The diode $D_1$ therefore acts as a variable admittance and by means of feedthrough capacitor $C_2$ is arranged to shunt part of the inductance $L$. As the varactor tuning voltage applied to terminal 2 is increased the capacitance of the varactor diodes $VD_1$ and $VD_2$ decrease causing the tuned frequency of the tuned circuit to be increased. As the tuned frequency increases the $Q$-factor of the varactor diodes $VD_1$ and $VD_2$ increases but the effect of this is counteracted by the shunting effect of the PIN diode $D_1$ the admittance of which increases with increase of the varactor tuning voltage, so that the overall $Q$-factor of the circuit remains substantially constant.

The circuit so far described although providing some degree of compensation tends to suffer from three disadvantages: a. The value of resistor $R_2$ is required to be very high (i.e. in the order of 10 —20 M Ω) which gives poor reliability;

b. The PIN N diode $D_1$ will still conduct at very low varactor tuning voltages which results in undesirable damping at the low end of the frequency band; and, c. The varactor drive voltage/frequency curve is very nonlinear, with the result that overcompensation is obtained at the extreme ends of the band and undercompensation is obtained at midband.

Figure 3:
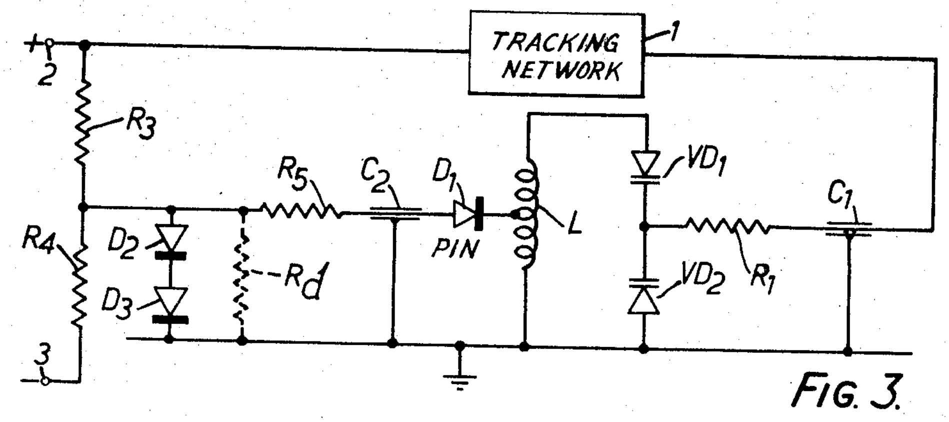
FIG. 3 is a circuit diagram of an improved form of the tuned circuit arrangement of FIG. 2.

These disadvantages can be virtually eliminated by modifying the circuit as shown in FIG. 3. In this arrangement the resistor $R_5$ (which corresponds to the resistor $R_2$ in FIG. 2) instead of being fed directly from the varactor tuning voltage via terminal 2 as in the FIG. 2 arrangement, is taken to the junction of a potential divider arrangement formed by resistors $R_3$ and $R_4$ which are connected between the terminal 2 and a negative potential with respect to earth via terminal 3. By suitable choosing the values of resistors $R_3$ and $R_4$ the point at which the PIN diode $D_1$ starts to conduct can be determined. In this way, at low varactor tuning voltages (i.e. the low frequency end of the band), the PIN diode $D_1$ can be reverse biased so that no undue damping of the tuned circuit is obtained. From the junction of the two resistors $R_3$ and $R_4$ there are also taken two series connected PIN diodes $D_2$ and $D_3$ which are connected to earth and these have the effect of making the bias current of PIN diode $D_1$ proportional to the logarithm of the varactor tuning voltage instead of proportional to the varactor tuning voltage as was the case in the FIG. 2 arrangement, and this provides much more accurate compensation over the frequency band.

In the arrangement shown, due to the fact that the forward conductance characteristic of the PN diodes $D_2$ and $D_3$ has a very sharp "knee," the PIN diode $D_1$ enters conduction very sharply as the tuning voltage is increased. The effect of this is to produce a dip in the overall gain at that point in the tuning characteristic which is undesirable. By providing a suitable damping resistance *Rd* across the PN diodes $D_2$ and $D_3$, as shown in broken lines, the sharpness of the "knee" is reduced and the dip in gain is virtually eliminated.

Two diodes $D_2$ and $D_3$ are used due to the fact that the forward voltage drop of a PIN diode is greater than the forward voltage drop of a PN diode so that a single PN diode would not allow the PIN diode to be completely forward biased. The provision of the diodes $D_2$ and $D_3$ also has the desirable effect that as the temperature coefficient of voltage of the diodes is slightly grater than the temperature coefficient of voltage of the PIN diode $D_1$, less compensation is obtained as the temperature is increased and this has the effect of counteracting increased tuned circuit losses due to increase in temperature brought about by the changes in series resistance of the varactor diodes.

The values of the resistor $R_3$, $R_4$ and $R_5$ are all comparatively low (e.g. 100 Ω to 470 Ω) so that metal oxide resistors may be used for maximum reliability. The resistor $R_5$ may also be variable so that the compensation may be preset to give optimum results.

Although in the two arrangements described tuned circuits having two varactor diodes in back-to-back configuration are described, it should be appreciated that other varactor diode configurations may be used. It is also envisaged that diodes other than PIN diodes may be used, the requirement being that is should be a slow diode with a low capacitance so that at the frequency of operation it presents a resistive rather than capacitive impedance.

Experimental results on the circuit of FIG. 3 have shown that a variation in gain over the frequency band of 20 db. without compensation may be reduced to ±1 db. with compensation.

There will now be described a tuned circuit arrangement according to the present invention using frequency dependent damping but before doing so some properties of transmission lines will be discussed.

From transmission line theory it can be shown that a short-circuited transmission line present a low admittance (i.e. open circuit) when operated at a frequency whose wavelength is four times the length of the line and presents a high admittance (i.e. short circuit) when operated at a frequency whose wavelength is twice the length of the line. This characteristic may be used in conjunction with a fixed resistance to provide a device whose admittance varies with frequency and such a device (herein referred to as a frequency dependent resistor) is shown in FIG. 4.

Figure 4:
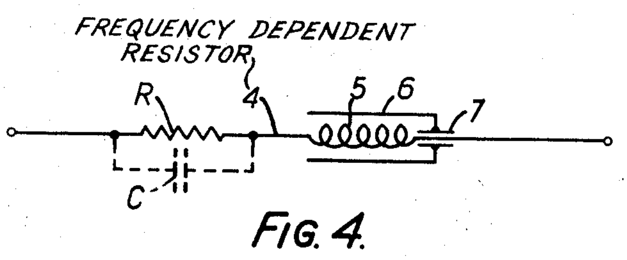
FIG. 4 is a schematic representation of a frequency dependent resistor.

The frequency dependent resistor represented generally by the reference numeral 4 in FIG. 4 consists of a transmission line formed from a helical coil 5 positioned coaxially in a length of conducting tube 6. One end of the coil 5 and tube 6 are effectively shorted together by means of a feedthrough capacitor 7 the impedance of which is arranged to be small at the frequency of operation of the device. The coil 5 is connected in series with a fixed resistance *R* the self-capacitance *C* of which is shown in dotted outline.

Figure 5:
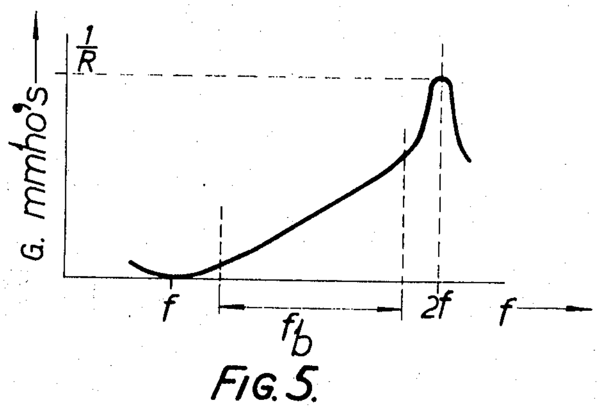
FIG. 5 shows the conductance/frequency characteristic of the frequency dependent resistor of FIG. 4.

FIG. 5 shows the conductance of the frequency dependent resistor 4 of FIG. 4 plotted against frequency and it can be seen that over a range of frequencies $f_b$, the conductance is substantially linear with frequency. Over this range the change in capacitance of the device is small. The effect of the self-capacitance *C* of the resistor R is to slightly increase the frequency band $f_b$. A device used over the frequency range $f_b$ is therefore ideally suited for compensating for the increase in $Q$-factor with frequency of a varactor tuned circuit.

Figure 6:
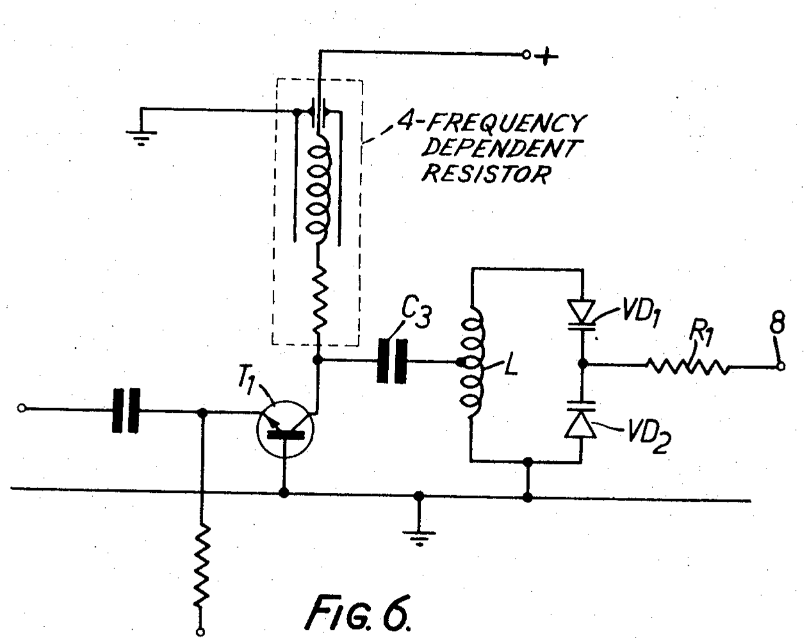
FIG. 6 is a tuned circuit arrangement according to the present invention incorporating the frequency dependent resistor of FIG. 4.

FIG. 6 shows a tuned circuit arrangement incorporating this feature and it shows a frequency dependent resistor 4 connected in the collector circuit of a transistor $T_1$. The transistor $T_1$ is shown in grounded-base configuration and could in practice by the final stage of amplification which normally precedes the tuned circuit in varactor tuned circuit arrangements. The tuned circuit proper consists of a tapped inductance *L* which has connected in parallel with it two varactor diodes $VD_1$ and $VD_2$ in back-to-back configuration, the varactor diodes being tuned by applying a tuning voltage to their junction via resistor $R_1$ and terminal 8, as has been hereinbefore described. The frequency dependent resistor 4 is arranged to shunt the tuned circuit (as far as AC signals are concerned) by means of coupling capacitor $C_3$.

In operation, a tuning voltage is applied to terminal 8, and when this voltage is increased to increase the tuned frequency of the tuned circuit the $Q$-factors of the varactor diodes $VD_1$ and $VD_2$ tend to increase. At the same time the conductance of the frequency dependent resistor 4 increases and as this shunts the tuned circuit it has the effect of counteracting the increase in $Q$-factor so that the loaded $Q$-factor of the tuned circuit over the frequency band is substantially constant.

It should be appreciated that minor modifications may be made to the circuit arrangement described without affecting the principle of operation. For instance, it is not essential that the center conductor 5 of the transmission line be in the form of a helical coil, since it could take any convenient form, the helical coil being chosen in the described embodiment as this tends to increase the effective length of the transmission line. It is also possible that transmission lines having an open circuit instead of a short circuit may be used but in some applications this may lead to practical difficulties in achieving the open-circuit due to stray capacitance. Although the tuned circuit described utilizes two varactor diodes in back-to-back configuration, it should be appreciated that other varactor diode configurations could be used.

The frequency dependent resistor described with reference to FIG. 4 has the advantage that it exhibits the impedance characteristics of a resistor/capacitor and yet has the ability pass DC. It also has a near linear conductance/frequency characteristic over nearly an octave range, as well as a large maximum/minimum conductance ratio and it can be made relatively small at low cost.

We claim:

1. A tuned circuit arrangement comprising a single tuned circuit having varactor diode means for the tuning thereof over a band of frequencies in dependence upon an applied tuning voltage, a tapped inductance forming part of the tuned circuit, and compensation means including a PIN diode interposed between the inductance tap and the applied tuning voltage so that it operates on that part of its admittance/forward current characteristic that is substantially linear, the compensation means being effective for providing selective damping to said tuned circuit so that the loaded $Q$-factor of the tuned circuit arrangement remains substantially constant.

2. A tuned circuit arrangement as claimed in claim 1, in which the PIN diode is connected in series with an electrical resistance so that the PIN diode current is substantially proportional to the applied tuning voltage.

3. A tuned circuit arrangement as claimed in claim 1, in which the PIN diode is connected between the tap of the inductance and the junction of a potential divider network connected effectively between the applied tuning voltage and a voltage of opposite polarity so that the PIN diode is reverse biassed at low applied tuning voltage levels.

4. A tuned circuit arrangement as claimed in claim 3, in which the potential divider network has associated with it further diode means which ensures that the PIN diode current is substantially proportional to the logarithm of the applied tuning voltage.

5. A tuned circuit arrangement as claimed in claim 4, in which the further diode means are shunted by an electrical resistance.

6. A tuned circuit arrangement comprising a single tuned circuit having varactor diode means for the tuning thereof over a band of frequencies in dependence upon an applied tuning voltage and compensation means for providing selective damping to said tuned circuit so that the loaded $Q$-factor of the tuned circuit arrangement remains substantially constant, the compensation means comprising a transmission line, which is effectively short circuited, connected in series with a resistance, the length of the transmission line corresponding effectively to between a quarter and half wavelength of the frequency of the tuned circuit.

7. A tuned circuit as claimed in claim 6, in which the transmission line takes the form of a helical coil positioned coaxially inside a conducting tube.

8. A tuned circuit arrangement as claimed in claim 6, in which the transmission line is connected in series with the collector circuit of a transistor and is arranged to shunt at least part of the tuned circuit by means of a coupling capacitor.